(12) United States Patent
Yoo et al.

(10) Patent No.: US 7,212,055 B2
(45) Date of Patent: May 1, 2007

(54) OPEN-LOOP DIGITAL DUTY CYCLE CORRECTION CIRCUIT WITHOUT DLL

(75) Inventors: Chang-Sik Yoo, Ichon-shi (KR); Chun-Seok Jeong, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 21 days.

(21) Appl. No.: 10/876,402

(22) Filed: Jun. 24, 2004

(65) Prior Publication Data

US 2005/0184779 A1 Aug. 25, 2005

(30) Foreign Application Priority Data

Feb. 19, 2004 (KR) ........................ 10-2004-0011135

(51) Int. Cl.
*H03K 3/017* (2006.01)

(52) U.S. Cl. ........................ 327/175; 327/161; 327/163

(58) Field of Classification Search ........ 327/172–176, 327/151–153, 161–163, 3, 12
See application file for complete search history.

(56) References Cited

U.S. PATENT DOCUMENTS

| | | | |
|---|---|---|---|
| 5,179,294 A * | 1/1993 | Bechade et al. ............ | 327/172 |
| 6,040,725 A * | 3/2000 | Lee et al. .................... | 327/175 |
| 6,084,482 A * | 7/2000 | Nakamura ................... | 331/44 |
| 6,100,735 A * | 8/2000 | Lu .............................. | 327/158 |
| 6,150,847 A * | 11/2000 | Lu .............................. | 326/93 |
| 6,285,226 B1 * | 9/2001 | Nguyen ...................... | 327/175 |
| 6,326,826 B1 * | 12/2001 | Lee et al. .................... | 327/161 |
| 6,452,432 B2 * | 9/2002 | Kim ........................... | 327/158 |
| 6,639,441 B2 * | 10/2003 | Ono et al. ................... | 327/175 |
| 6,677,792 B2 * | 1/2004 | Kwak .......................... | 327/158 |
| 6,859,081 B2 * | 2/2005 | Hong et al. ................. | 327/175 |
| 6,934,215 B2 * | 8/2005 | Chung et al. ................ | 365/233 |

* cited by examiner

*Primary Examiner*—Timothy P. Callahan
*Assistant Examiner*—Hai L. Nguyen
(74) *Attorney, Agent, or Firm*—Blakely Sokoloff Taylor & Zafman

(57) ABSTRACT

The present invention relates to a semiconductor circuit; and, more particularly, to a duty cycle correction circuit (hereinafter referred to as "DCC"). Furthermore, the present invention relates to an open-loop digital DCC. The duty cycle correction circuit according to the present invention includes: a delayer for delaying an input clock signal and for generating a plurality of delayed clock; a phase comparator for comparing the input clock signal with the plurality of delayed clock signals; a multiplexer for selecting one out of the delayed clock signals in response to an output signal of the phase comparator and for inverting the selected delay clock signals; and a phase combiner for combining the clock signal from the multiplexer and the input clock signal. Accordingly, the digital DCC according to the present invention is of an open loop without any DLL, the duty correction can be made within five clock periods after power-up.

12 Claims, 5 Drawing Sheets

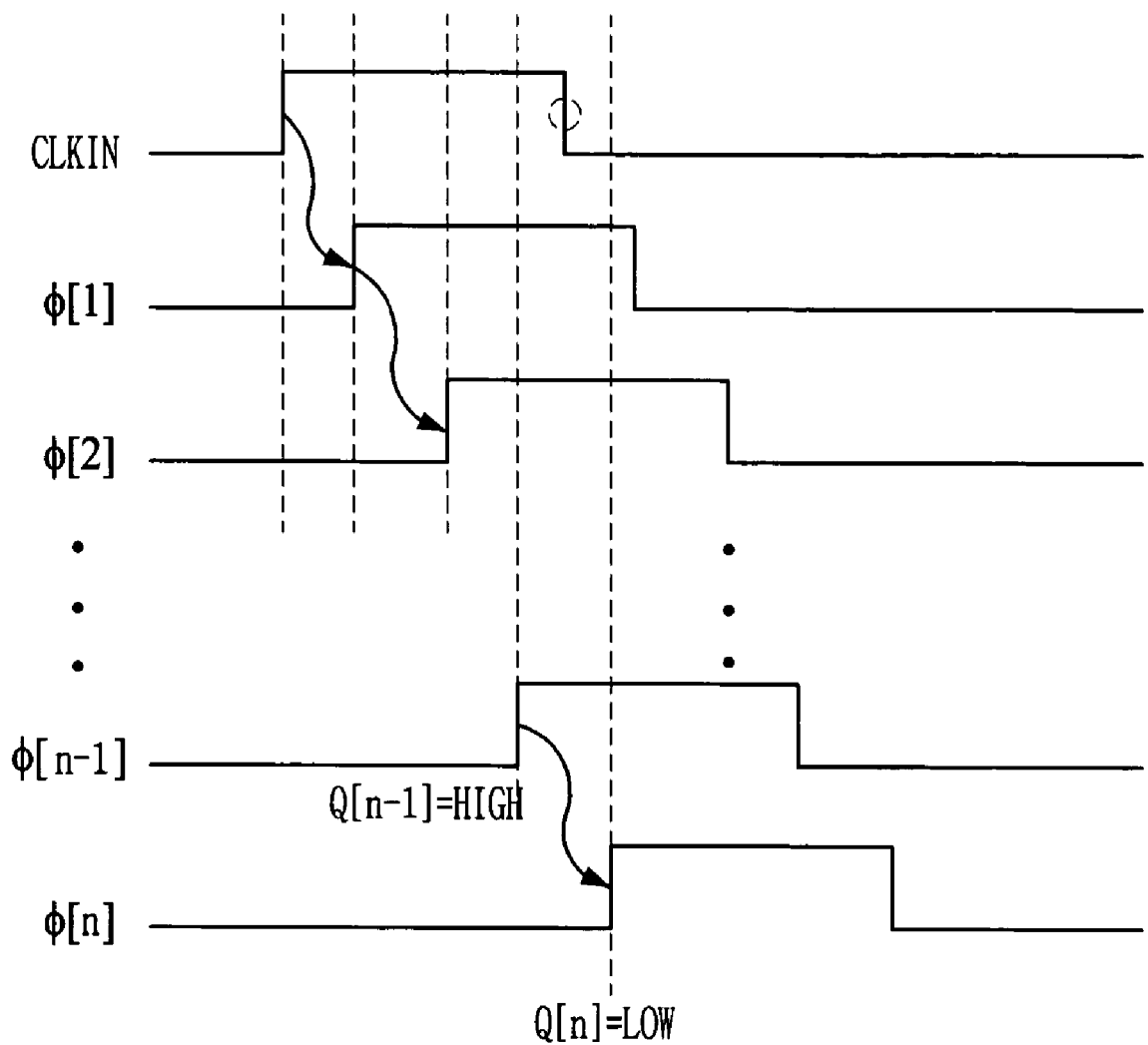

OPEN-LOOP DIGITAL DUTY CYCLE CORRECTION CIRCUIT WITHOUT DLL

FIELD OF THE INVENTION

The present invention relates to a semiconductor circuit; and, more particularly, to a duty cycle correction circuit (hereinafter referred to as "DCC"). Furthermore, the present invention relates to an open-loop digital DCC.

BACKGROUND OF THE INVENTION

Generally, a clock signal has been used as a reference signal in a clock synchronization system and also has been used to guarantee high-speed operation of the system without an error. When a clock signal from an external circuit is used for system synchronization, a delay time (clock skew) is generated in an internal circuit. To compensate for this clock skew, a clock synchronizing circuits, such as a delay locked loop and a phase locked loop, have been used.

On the other hand, in a DDR SDRAM (Double Data Rate Synchronous DRAM) to perform data input and output operations at rising and falling edges of a high-speed clock signal, it is very important to maintain a duty ratio of 50% for the effective margin of input/output data. Accordingly, a duty cycle correction circuit has been used for generating a clock signal in the constant duty ratio of 50%, irrespective of the duty ratio of the external clock signal, and for compensating for a duty variation of an undesired clock signal.

The duty cycle correction circuit can be classified into an analogue DCC and a digital DCC or into a closed-loop DCC and an open-loop DCC. The analogue DCC is typically implemented by the closed-loop DCC.

FIG. 1 is a schematic diagram illustrating a conventional analogue closed-loop DCC. As shown in FIG. 1, the conventional analogue closed-loop DCC includes a DLL circuit 10 to synchronize a phase of an internal clock signal with that of an external clock signal, a DCC amplifier 12 to amplify an output signal from the DLL 10, and a DCC integrator 14 to receive and integrate DLL clock signals dll_clk from the DCC amplifier 12 and then to provide information about a duty ratio to the DCC amplifier 12.

This analogue closed-loop DCC has merits in that the precision is very high and it is not susceptible to PVT fluctuation; however, it has a shortage in that it takes a lot of time to obtain a desired clock signal of the duty ratio of 50%. Most analogue DCCs have the integrator which stores information in a capacitor (Se Jun Kim et al., "A Low jitter, Fast recoverable, Fully analog DLL using Tracking ADC For High Speed and Low Stand-by power DDR I/O interface", in Symposium on VLSI Circuits Digest of Technical Papers, 2003). However, in a power-down mode, the information can be lost by a leakage current in the capacitor and therefore lots of time is required to perform a normal operation at the time of restart.

Although the digital DCCs including a DLL can solve the above problem of the analogue DCC by using a digital code, most of the digital DCCs need lots of time until a normal operation is performed after power-up (Tatsuya Matano et al., 'A 1-Gb/s/pin 512-Mb DDRII SDRAM using a slew-rate-controlled output buffer' in Symposium on VLSI Circuits Digest of Technical Papers, 2002).

SUMMARY OF THE INVENTION

It is, therefore, a primary object of the present invention to provide a to a duty cycle correction circuit capable of reducing an initial operation time by excluding a DLL.

In accordance with the present invention, there is provided a duty cycle correction circuit comprising: a delay means for delaying an input clock signal and for generating a plurality of delayed clock signals which are out of phase with each other; a phase comparison means for comparing the input clock signal with the plurality of delayed clock signals; a multiplexing means for selecting one out of the delayed clock signals in response to an output signal of the phase comparison means and for inverting the selected delay clock signals; and a phase combination means for combining the clock signal from the multiplexing means and the input clock signal.

Preferably, the delay means includes a delay chain having a plurality of unit delayers which are in series coupled to each other.

Preferably, the phase comparison means receives the plurality of delayed clock signals and includes a plurality of D flip-flop circuits which receive the plurality of delayed clock signals, respectively.

In the above, the multiplexing means includes: a controller for generating a plurality of switching control signals in response to output signals from the phase comparison means; a switching unit for selectively outputting one out of the delay clock signals in response to the switching control signals; and a phase inverting unit INV1 for inverting an output signal from the switching unit.

In the multiplexing means, the controller includes a plurality of control units, wherein the each of the control units is correspondent to each of the D flip-flop circuits in the from the phase comparison means, and wherein the control units receives an output signal from the D flip-flop circuit, which is positioned at the N-th stage in the phase comparison means, and a previous output signal from the D flip-flop circuit, which is positioned at the (N−1)-th stage in the phase comparison means, and outputs a control signal for a next stage and a switching control signal in response to a control signal from a previous stage.

Further, the switching unit includes a plurality of switches in order to selectively output one from the delayed clock signals in response to the switching control signals from the control units. Also, the phase inverting unit includes an inverter for inverting the delayed clock signals in response to the switching control signals from the control units.

Preferably, the control units includes: a first inverter to invert an output signal from the D flip-flop circuit, which is positioned at the (N−1)-th stage in the phase comparison means; a second inverter to invert an output signal from the D flip-flop circuit, which is positioned at the N-th stage in the phase comparison means; a third inverter to invert a control signal from the control unit at an (N−1)-th stage; a NOR gate to receive an output signal from the first inverter, the output signal from the D flip-flop circuit, which is positioned at the N-th stage in the phase comparison means and the output signal from the D flip-flop circuit, which is positioned at the N-th stage in the phase comparison means; a first NAND gate to receive an output signal from the inverter and the output signal from the D flip-flop circuit, which is positioned at the (N−1)-th stage in the phase comparison means; and a second NAND gate to receive output signals from the NAND gate and the inverter and to output a control signal for another control unit at a next stage.

In the above, the delay chain has an amount of delay time which is correspondent to 60% of a period of the input clock signal and the phase combination means includes a digital phase combiner having two inverters of which two output terminals have a short circuit.

Also, in accordance with the present invention, there is provided a duty cycle correction circuit comprising: a delay chain for delaying an input clock signal and for generating a plurality of delayed clock signals which are out of phase with each other, wherein the delay chain includes a plurality of unit delayers; a plurality of D flip-flop circuits for receiving the delayed clock signals from the unit delayers and the input clock signal as an input data; a plurality of control units, each of which receives an output signal from the D flip-flop circuit at a corresponding stage and an output signal from the D flip-flop circuits at a previous stage and generates a control signal and a switching control signal in response to a control signal from another control unit at a previous stage; a plurality of switches for selectively outputting one from the delayed clock signals in response to the switching signal from the control unit; and an inverter for inverting the selected delay clock signal; and a phase combination means for combining an clock signal from the inverter and the input clock signal.

BRIEF DESCRIPTION OF THE DRAWINGS

The above and other objects and features of the present invention will become apparent from the following description of preferred embodiments given in conjunction with the accompanying drawings, in which:

FIG. 4 is a timing diagram illustrating phase relations between an input clock signal and a delayed clock signal;

DETAILED DESCRIPTION OF THE PREFERRED EMBODIMENTS

Hereinafter, with reference to the accompanying drawings, a preferred embodiment of the present invention will be explained in detail.

Figure 2:
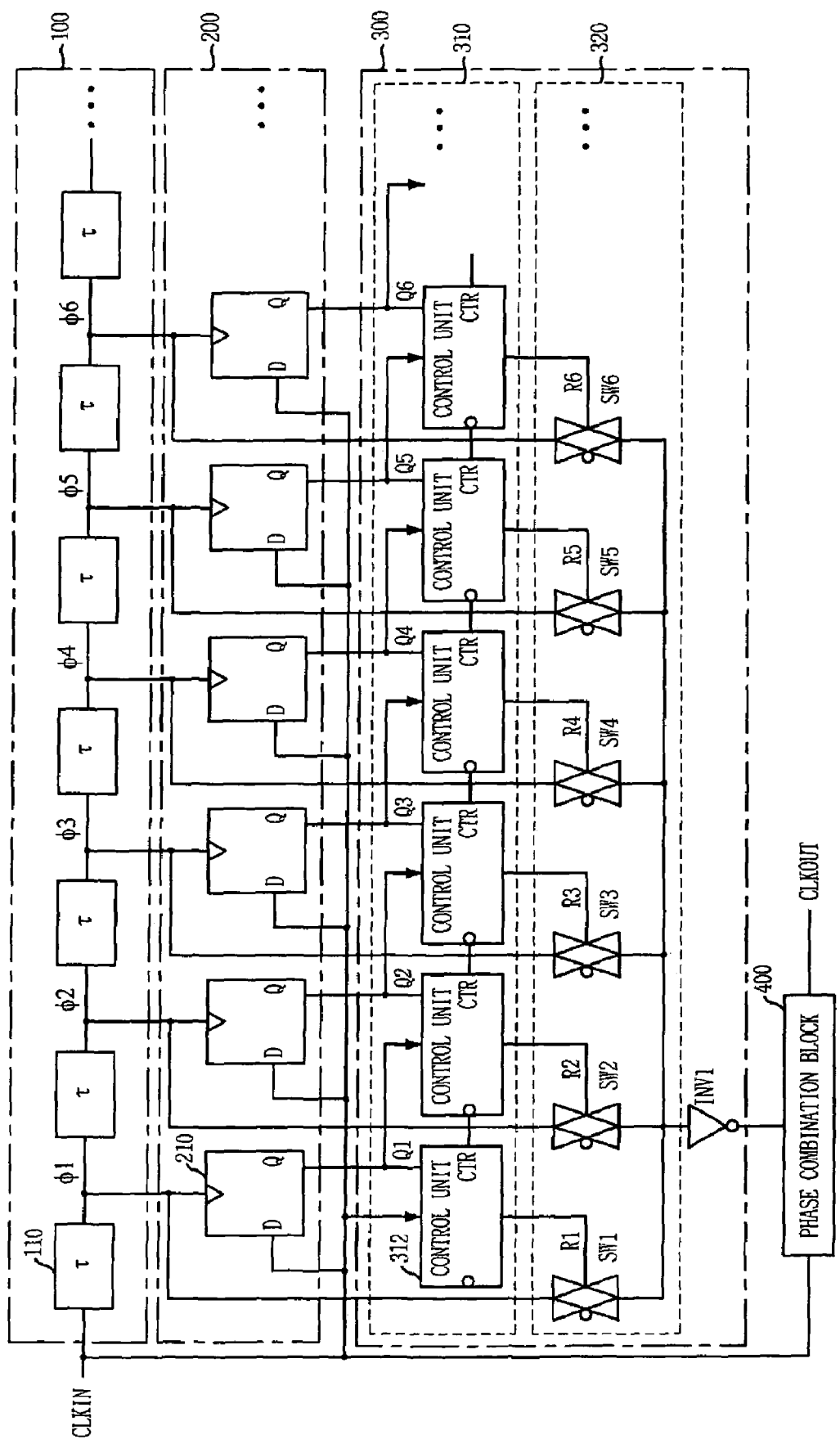
FIG. 2 is a schematic diagram illustrating an open-loop DCC in accordance with the present invention.

Referring to FIG. 2, there is provided an open-loop DCC in accordance with the present invention. The open-loop DCC includes a delay block 100, a phase comparison block 200, a multiplexing block 300 and a phase combination block 400.

The delay block 100 delays an input clock signal CLKIN and generates a plurality of delay clock signals ($\Phi[1]$, $\Phi[2]$, ..., $\Phi[n]$, ...) from the delayed input clock signal using a plurality of delay blocks. The phase comparison block 200 compares the input clock signal CLKIN with each of the plurality of delay clock signals ($\Phi[1]$, $\Phi[2]$, ..., $\Phi[n]$, ...). The multiplexing block 300 receives the plurality of delay clock signals ($\Phi[1]$, $\Phi[2]$, ..., $\Phi[n]$, ...) and outputs an inverted signal by selecting and inverting one from the plurality of delay clock signals ($\Phi[1]$, $\Phi[2]$, ..., $\Phi[n]$, ...) in response to output signals ($\Phi[1]$, $\Phi[2]$, ..., $\Phi[n]$, ...) from the phase comparison block 200. The phase combination block 400 combines a clock signal from the multiplexing block 300 and the input clock signal CLKIN.

The delay block 100 is a delay chain having a plurality of unit delayers 110. The unit delayer 110 can be implemented by two inverters which are in series coupled to each other and the unit delayer 110 has a unit delay time ($\tau$) of 170 ps. Also, fifteen (15) unit delayers can be employed in order that the input clock signal CLKIN operates up to 60% in the duty ratio at 250 MHz (tCK=4ns).

The phase comparison block 200 includes a plurality of D flip-flop circuits 210 which receives the plurality of delay clock signals ($\Phi[1]$, $\Phi[2]$, ..., $\Phi[n]$, ...). The multiplexing block 300 includes: a controller 310 for generating a plurality of switching control signals (R1, R2, ..., Rn, ...) in response to output signals ($\Phi[1]$, $\Phi[2]$, ..., $\Phi[n]$, ...) from the phase comparison block 200; a switching unit 320 for selectively outputting one out of the plurality of delay clock signals ($\Phi[1]$, $\Phi[2]$, ..., $\Phi[n]$, ...) in response to the switching control signals (R1, R2, ..., Rn, ...); and a phase inverting unit INV1 for inverting an output signal from the switching unit 320. Also, a phase blender of which two output terminals have a short circuit can be employed as the phase combination block 400.

On the other hand, the controller 310 includes a plurality of control units 312. Each of the control units 312 receives the output signal Qn from the D flip-flop circuit 210, which is positioned at the N-th stage in the phase comparison block 200, and the previous output signal Qn−1 from the D flip-flop circuit 210, which is positioned at the (N−1)-th stage in the phase comparison block 200, and outputs a control signal CTR_n for the next stage and the switching control signal Rn in response to a control signal (CTR[n−1]) from the previous stage. The switching unit 320 includes a plurality of switches (sw1, sw2, ..., swn, ...) in order to selectively output one from the delayed clock signals ($\Phi[1]$, $\Phi[2]$, ..., $\Phi[n]$ ...).

Figure 1:
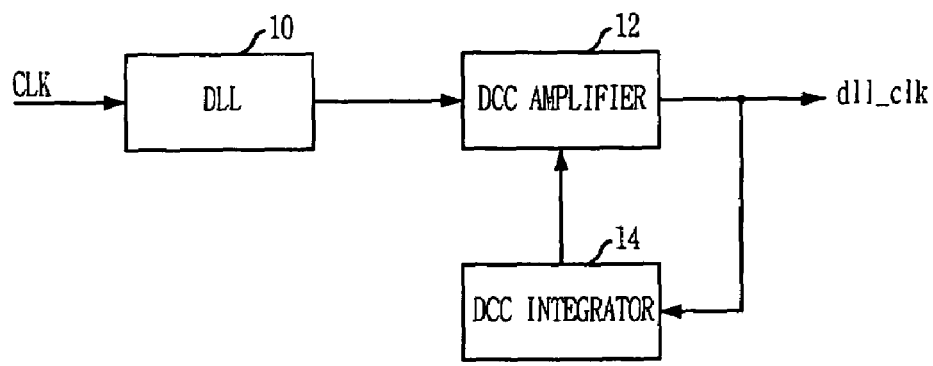
FIG. 1 is a schematic diagram illustrating a conventional analogue closed-loop DCC.
Figure 3:
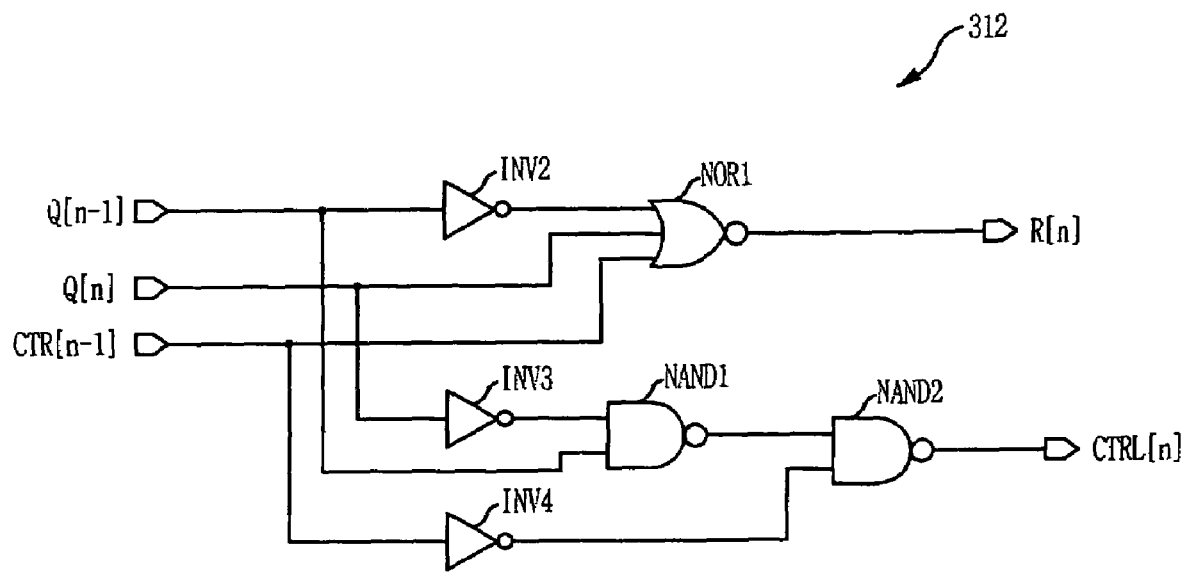
FIG. 3 is a block diagram illustrating a control unit in FIG. 2.

FIG. 3 is a block diagram illustrating a control unit in FIG. 2. As shown in FIG. 3, each of the control units 312 includes: an inverter INV2 to invert the output signal Qn−1 from the D flip-flop circuit 210, which is positioned at the (N−1)-th stage in the phase comparison block 200; an inverter INV3 to invert the output signal Qn from the D flip-flop circuit 210, which is positioned at the N-th stage in the phase comparison block 200; an inverter INV4 to invert the control signal (CTR[n−1]) from the previous stage ((N−1)-th control unit); a NOR gate NOR1 to receive an output signal from the inverter INV2, the output signal Q[n] from the N-th stage and the control signal (CTR[n−1]); a NAND gate NAND1 to receive an output signal from the inverter INV3 and the output signal Q[n−1] from the (N−1)-th stage; and a NAND gate NAND2 to receive output signals from the NAND gate NAND1 and the inverter INV4 and to output the control signal CTR [n] for other control units 312 at the next stage.

Figure 5:
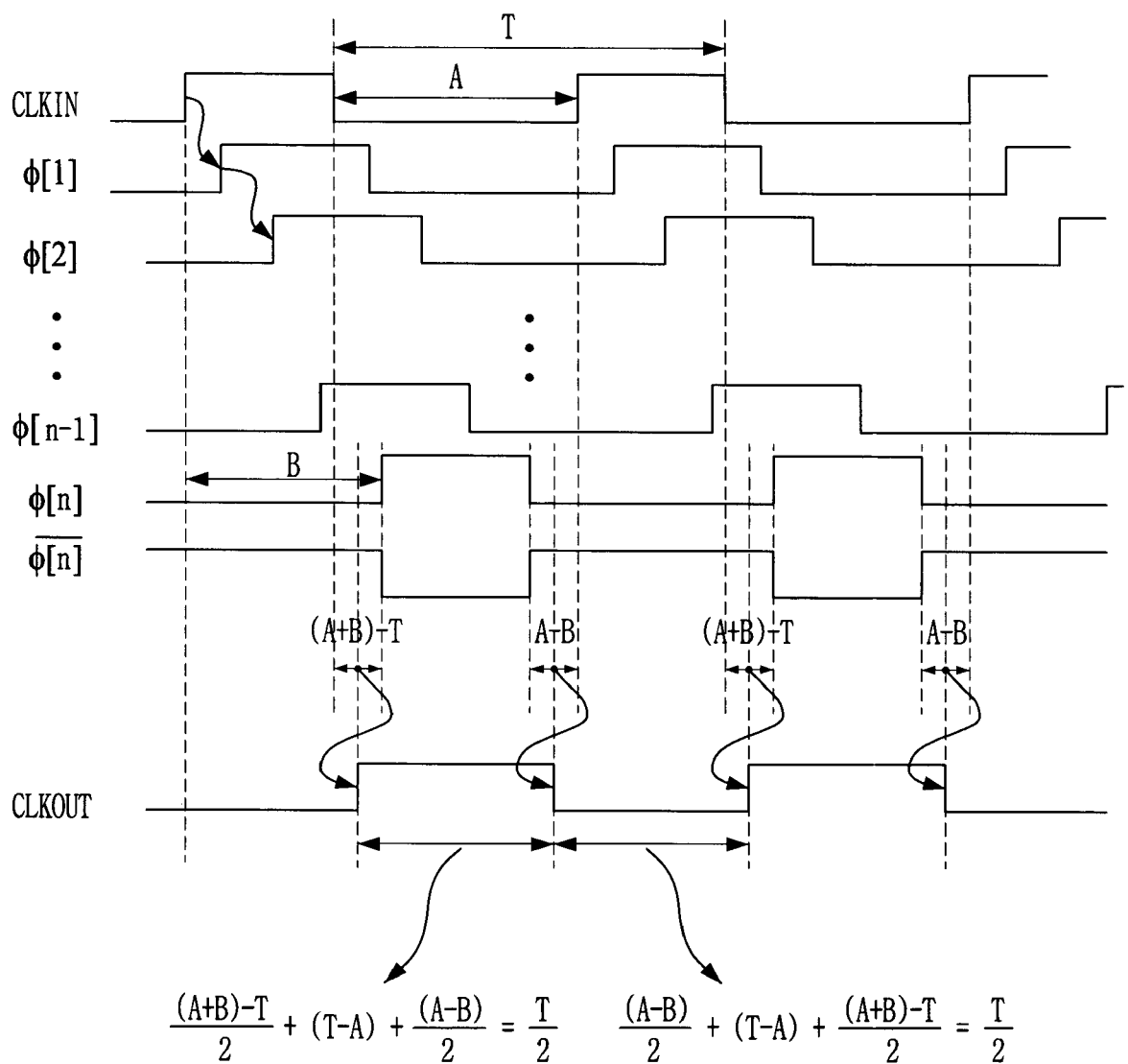
FIG. 5 is a timing diagram of the open-loop DCC in FIG. 2.

FIG. 4 is a timing diagram illustrating phase relations between an input clock signal and a delayed clock signal and FIG. 5 is a timing diagram of the open-loop DCC in FIG. 2.

Referring to FIG. 4, the D flip-flop circuits 210 in the phase comparison block 200 decides whether the input clock signal CLKIN leads or lags behind the delayed clock signals ($\Phi[1]$, $\Phi[2]$, ..., $\Phi D[n]$, ...), by comparing a falling edge of the input clock signal CLKIN with a rising edge of the delayed clock signals ($\Phi[1]$, $\Phi[2]$, ..., $\Phi[n]$, ...). That is, the input clock signal CLKIN is inputted into the delay block 100 and the input clock signal CLKIN is gradually delayed by the delay unit in the delay block 100 with the generation of the delayed clock signals ($\Phi[1]$, $\Phi[2]$, ..., $\Phi[n]$, ...). As a result, a rising edge of the N-th delayed clock signal Φ[n] lags behind the falling edge of the input clock signal CLKIN so that the falling edge of the input clock signal CLKIN is positioned between a rising edge of the (N−1)-th delayed clock signal Φ[n−1] and the rising edge of the N-th delayed clock signal Φ[n].

Accordingly, an output signal Q[n] of the N-th D flip-flop circuit is different from the output signal Q[n−1] of the (N−1)-th D flip-flop circuit and the controller 310 in the multiplexing block 300 turns off all the switches except for a N-th switch SWn using such the difference between output signals of the D flip-flop circuits. Therefore, an output signal of the switching unit 320 is to be a delayed clock signal Φ[n] from the N-th unit delayer 110 and this delayed clock signal Φ[n] is inverted by the inverter INV2.

On the other hand, the phase combination block 400 combines the inverted delay clock signal/Φ[n] (when the Φ[n] is activated, there is in a low level) and the input clock signal CLKIN and outputs an output clock signal CLKOUT having an intermediate phase between the falling and rising edges of the two clock signals.

Referring to FIG. 5, the falling edge of the input clock signal CLKIN and the falling edge of the inverted delay clock signal/Φ[n] from the inverter INV1 are out of phase by (A+B)−T and the rising edge of the input clock signal CLKIN and the rising edge of the inverted delay clock signal/Φ[n] from the inverter INV1 are out of phase by A−B, where T is a period of the input clock signal CLKIN, A is a low section of the input clock signal CLKIN and B is a total amount of delay time of the corresponding delay clock signal Φ[n], n*τ.

The output clock signal CLKOUT caused by the phase combination has a high level section of T/2 and a low level section of T/2 as follows:

high level section: $((A+B)-T)/2+(T-A)+(A-B)/2=T/2$ low level section: $(A-B)/2+(T-A)+((A+B)-T)/2=T/2$ As a result, the output clock signal CLKOUT has a duty ratio of 50%.

Figure 6:
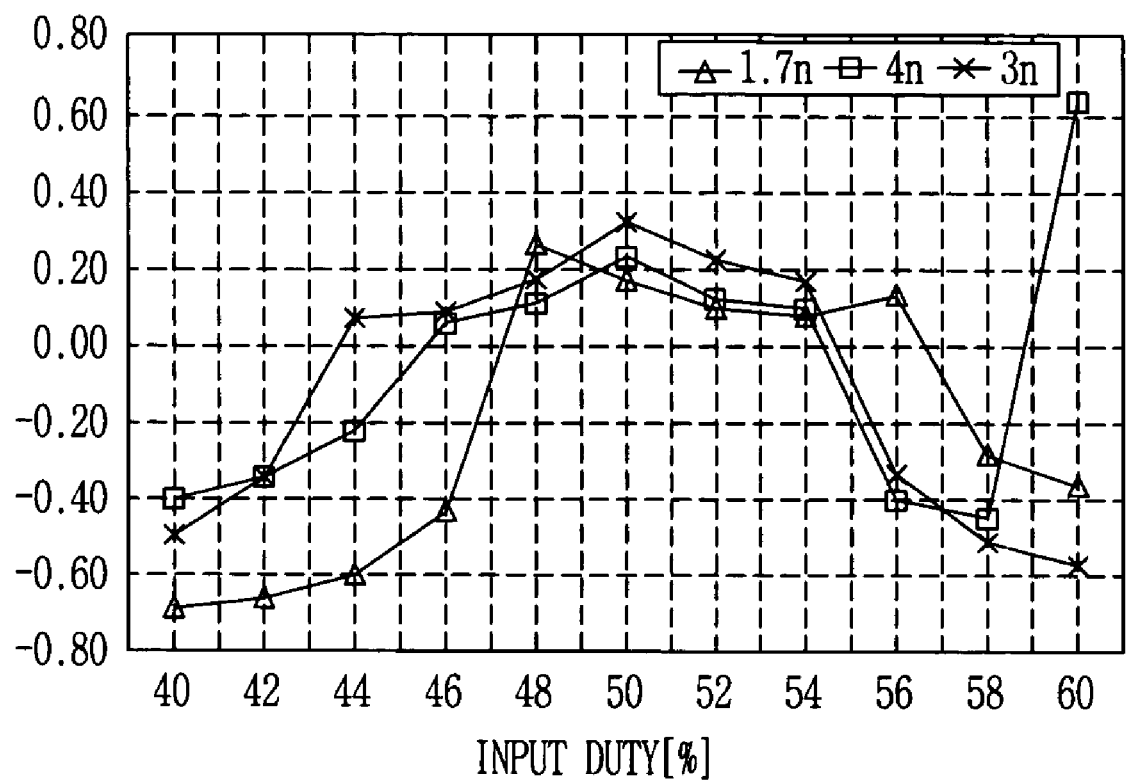
FIG. 6 is a plot showing an output duty error in the open-loop DCC in FIG. 2.

FIG. 6 is a plot showing an output duty error in the open-loop DCC in FIG. 2 and this simulation is carried out by HSPICE. Referring to FIG. 6, 50% duty output is obtained on the input clock signal CLKIN having the duty ratio of 40% to 50% and bandwidth of 250 MHz (tCK=4ns) to 600 MHz (tCK=1.7n).

As illustrated above, the digital DCC according to the present invention reduces an initial operation time. That is, the digital DCC according to the present invention is of an open loop without any DLL, the duty correction can be made within five clock periods after power-up.

The present application contains subject matter related to Korean patent application No. 2004-11135, filed in the Korean Patent Office on Feb. 19, 2004, the entire contents of which being incorporated herein by reference.

Although the preferred embodiments of the invention have been disclosed for illustrative purposes, those skilled in the art will appreciate that various modifications, additions and substitutions are possible, without departing from the scope and spirit of the invention as disclosed in the accompanying claims. For example, the present invention illustrates the phase comparison block using the D flip-flop; however, other types of the flip-flops may be available to implement the phase comparison block.

What is claimed is:

1. A duty cycle correction circuit comprising:
   a delay means for delaying an input clock signal and for generating a plurality of delayed clock signals which are out of phase with each other;
   a phase comparison means for comparing the input clock signal with the plurality of delayed clock signals;
   a multiplexing means for selecting one out of the plurality of delayed clock signals in response to a comparison result of the phase comparison means and for inverting the selected delay clock signal, wherein the multiplexing means includes a controller having a plurality of control units, each being correspondent to each D flip-flop circuit in the phase comparison means; and
   a phase combination means for combining the inverse selected delay signal outputted from the multiplexing means and the input clock signal.

2. The duty cycle correction circuit as recited in claim 1, wherein the delay means includes a delay chain having a plurality of unit delayers which are in series coupled to each other.

3. The duty cycle correction circuit as recited in claim 1, wherein the phase comparison means receives the plurality of delayed clock signals and includes a plurality of D flip-flop circuits which receive the plurality of delayed clock signals, respectively.

4. The duty cycle correction circuit as recited in claim 1, wherein the multiplexing means includes:
   the controller for generating a plurality of switching control signals in response to output signals from the phase comparison means;
   a switching unit for selectively outputting one out of the delay clock signals in response to the switching control signals; and
   a phase inverting unit for inverting an output signal from the switching unit.

5. The duty cycle correction circuit as recited in claim 4, wherein the control units receives an output signal from the D flip-flop circuit, which is positioned at the N-th stage in the phase comparison means, and a previous output signal from the D flip-flop circuit, which is positioned at the (N−1)-th stage in the phase comparison means, and outputs a control signal for a next stage and a switching control signal in response to a control signal from a previous stage.

6. The duty cycle correction circuit as recited in claim 5, wherein the switching unit includes a plurality of switches in order to selectively output one from the delayed clock signals in response to the switching control signals from the control units.

7. The duty cycle correction circuit as recited in claim 6, wherein the phase inverting unit includes an inverter for inverting the delayed clock signals in response to the switching control signals from the control units.

8. The duty cycle correction circuit as recited in claim 5, wherein the control units includes:
   a first inverter to invert an output signal from the D flip-flop circuit, which is positioned at the (N−1)-th stage in the phase comparison means;
   a second inverter to invert an output signal from the D flip-flop circuit, which is positioned at the N-th stage in the phase comparison means;
   a third inverter to invert a control signal from the control unit at an (N−1)-th stage;
   a NOR gate to receive an output signal from the first inverter, the output signal from the D flip-flop circuit, which is positioned at the N-th stage in the phase comparison means and the output signal from the D flip-flop circuit, which is positioned at the N-th stage in the phase comparison means;

a first NAND gate to receive an output signal from the inverter and the output signal from the D flip-flop circuit, which is positioned at the (N−1)-th stage in the phase comparison means; and a second NAND gate to receive output signals from the NAND gate and the inverter and to output a control signal for another control unit at a next stage.

9. The duty cycle correction circuit as recited in claim 2, wherein the delay chain has an amount of delay time which is correspondent to 60% of a period of the input clock signal.

10. The duty cycle correction circuit as recited in claim 1, wherein the phase combination means includes a digital phase combiner having two inverters of which two output terminals have a short circuit.

11. A duty cycle correction circuit comprising:

a delay chain for delaying an input clock signal and for generating a plurality of delayed clock signals which are out of phase with each other, wherein the delay chain includes a plurality of unit delayers;

a plurality of D flip-flop circuits for receiving the delayed clock signals from the unit delayers and the input clock signal as an input data;

a plurality of control units, each of which receives an output signal from the D flip-flop circuit at a corresponding stage and an output signal from the D flip-flop circuits at a previous stage and generates a control signal and a switching control signal in response to a control signal from another control unit at a previous stage;

a plurality of switches for selectively outputting one from the delayed clock signals in response to the switching signal from the control unit;

an inverter for inverting the selected delay clock signal; and a phase combination means for combining a clock signal from the inverter and the input clock signal.

12. The duty cycle correction circuit as recited in claim 11, wherein the control units includes:

a first inverter to invert an output signal from the D flip-flop circuit, which is positioned at the (N−1)-th stage in the phase comparison means;

a second inverter to invert an output signal from the D flip-flop circuit, which is positioned at the N-th stage in the phase comparison means;

a third inverter to invert a control signal from the control unit at an (N−1)-th stage;

a NOR gate to receive an output signal from the first inverter, the output signal from the D flip-flop circuit, which is positioned at the N-th stage in the phase comparison means and the output signal from the D flip-flop circuit, which is positioned at the N-th stage in the phase comparison means;

a first NAND gate to receive an output signal from the inverter and the output signal from the D flip-flop circuit, which is positioned at the (N−1)-th stage in the phase comparison means; and a second NAND gate to receive output signals from the NAND gate and the inverter and to output a control signal for another control unit at a next stage.

* * * * *